(12) United States Patent
Yee

(10) Patent No.: US 9,379,202 B2
(45) Date of Patent: Jun. 28, 2016

(54) DECOUPLING CAPACITORS FOR INTERPOSERS

(71) Applicant: NVIDIA Corporation, Santa Clara, CA (US)

(72) Inventor: Abraham F. Yee, Cupertino, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 109 days.

(21) Appl. No.: 13/674,533

(22) Filed: Nov. 12, 2012

(65) Prior Publication Data

US 2014/0131834 A1   May 15, 2014

(51) Int. Cl.
*H01L 29/92* (2006.01)
*H01L 29/66* (2006.01)
*H01L 27/08* (2006.01)
*H01L 29/94* (2006.01)

(52) U.S. Cl.
CPC ...... *H01L 29/66181* (2013.01); *H01L 27/0811* (2013.01); *H01L 29/66189* (2013.01); *H01L 29/94* (2013.01)

(58) Field of Classification Search
USPC ......... 257/734, 760, 758, 754, 750, 740, 351, 257/350
See application file for complete search history.

(56) References Cited

U.S. PATENT DOCUMENTS

| | | | | |
|---|---|---|---|---|
| 5,631,492 A * | 5/1997 | Ramus | ................ | H01L 27/0207 257/401 |
| 6,320,237 B1 * | 11/2001 | Assaderaghi | ........... | H01L 29/94 257/296 |
| 6,507,063 B2 * | 1/2003 | Coolbaugh et al. | ........... | 257/300 |
| 6,940,705 B2 * | 9/2005 | Yeo | ..................... | H01L 27/0805 257/402 |
| 7,247,543 B2 * | 7/2007 | Shih et al. | ...................... | 438/396 |
| 7,297,587 B2 * | 11/2007 | Wu et al. | ........................ | 438/216 |
| 7,301,223 B2 * | 11/2007 | Rodney et al. | ................ | 257/629 |
| 2004/0140527 A1 * | 7/2004 | Furuya | ................ | H01L 27/0805 257/532 |
| 2006/0186511 A1 * | 8/2006 | Arnborg et al. | ................ | 257/595 |
| 2008/0067659 A1 | 3/2008 | Kim et al. | | |
| 2009/0290282 A1 * | 11/2009 | Knickerbocker | ...... | H01G 4/232 361/306.2 |
| 2011/0108948 A1 * | 5/2011 | Kim et al. | ..................... | 257/532 |

OTHER PUBLICATIONS

Van Zant, Peter, Microchip Fabrication: A Practical Guide to Semiconductor Processing, eBook. 5th edition. Accession No. 244099. Chapter 7, p. 163.*

* cited by examiner

*Primary Examiner* — Cuong Q Nguyen
*Assistant Examiner* — Nishath Yasmeen
(74) *Attorney, Agent, or Firm* — Artegis Law Group, LLP

(57) ABSTRACT

Embodiments of the invention generally relate to interposers for packaging integrated circuits. The interposers include capacitive devices for reducing signal noise and leakage between adjacent integrated circuits coupled to the interposers. The capacitive devices are formed from doped semiconductor layers. In one embodiment, an interposer includes a substrate having doped regions of opposing conductivities. First and second oxide layers are disposed over the doped regions. A first interconnect disposed in the second oxide layer is electrically coupled to a doped region of a first conductivity, and a second interconnect disposed in the second oxide is electrically coupled to a doped region of a second conductivity. Additional capacitive devices utilizing doped semiconductor layers are also disclosed.

24 Claims, 5 Drawing Sheets

US 9,379,202 B2

DECOUPLING CAPACITORS FOR INTERPOSERS

BACKGROUND OF THE INVENTION

1. Field of the Invention

Embodiments of the invention generally relate to electronic device packaging, and more specifically, to decoupling capacitors for interposers.

2. Description of the Related Art

An interposer is a substrate upon which one or more integrated circuits are disposed. When multiple integrated circuits are disposed on an interposer, the interposer may provide an electrical connection therebetween. In order to reduce the path length of electrical current between the integrated circuits, thereby improving efficiency, it is desirable to position the integrated circuits in close proximity to one another on the interposer. However, signal noise and current leakage due to the shifting of transistor state in one integrated circuit negatively affects the performance of adjacent integrated circuits.

Previous attempts to decrease the signal noise and voltage current between integrated circuits have included the formation of a decoupling capacitor on an interposer. The decoupling capacitors include a first metal layer, an electrically-insulating layer disposed on the first metal layer, and a second metal layer disposed on the insulating layer. The metal-insulator-metal decoupling capacitors are relatively expensive, however, due to the material cost of the metal layers. Additionally, the metal-insulator-metal decoupling capacitors do not provide sufficient decoupling of the integrated circuits because the metal-insulator-metal decoupling capacitors have relatively low capacitances.

Therefore, there is a need for a capacitive device for interposers having a higher capacitance and a reduced manufacturing cost.

SUMMARY OF THE INVENTION

In one embodiment of the invention, an interposer for integrated circuits is disclosed. The interposer includes a substrate having a first conductivity type, a doped region of the first conductivity type on an upper surface of the substrate, and a doped region of a second conductivity type on the upper surface of the substrate. A first oxide layer is disposed over the upper surface of the substrate. The first oxide layer has openings therethrough to expose a portion of the doped region of the first conductivity type and a portion of the doped region of the second conductivity type. A second oxide layer is disposed over the first oxide layer, and a plurality of interconnects are formed within vias disposed in the second oxide layer.

In another embodiment, an interposer for integrated circuits includes a substrate having a first conductivity type, and a doped region of a second conductivity type on an upper surface of the substrate. A first oxide layer is disposed on the upper surface of the substrate. The first oxide layer has openings therethrough to expose portions of the substrate. A polysilicon layer including a dopant of the second conductivity type is disposed on the first oxide layer. A second oxide layer is disposed over the polysilicon layer and the first oxide layer, and a plurality of interconnects are formed within vias formed in the second oxide layer.

Benefits of the present invention include efficient and inexpensive capacitive devices for interposers. The capacitive devices are formed using doped semiconductor layers, and thus, do not require relatively expensive metal layers. Moreover, the capacitance of the capacitive devices of the present invention is about 5 times to about 50 times greater than the capacitance of decoupling capacitors utilizing a metal-insulator-metal structure. The capacitive devices of the present invention more effectively reduce signal noise and leakage between adjacent integrated circuits, thereby improving device performance.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the invention generally relate to interposers for packaging integrated circuits. The interposers include capacitive devices for reducing signal noise and leakage between adjacent integrated circuits coupled to the interposers. The capacitive devices are formed from doped semiconductor layers.

FIGS. 1A-1I illustrate the formation of a capacitive device for an interposer, according to one embodiment of the invention. The interposer includes a semiconductor substrate, such as p-type silicon substrate 102 shown in FIG. 1A. Formation of the capacitive device begins by thermally growing a silicon dioxide layer 104 on the upper surface of the p-type silicon substrate 102 in an oxygen-containing environment. The silicon dioxide layer 104 is grown to a thickness of about 10 angstroms to about 200 angstroms, for example, about 90 angstroms, via thermal oxidation.

Figure 1A:
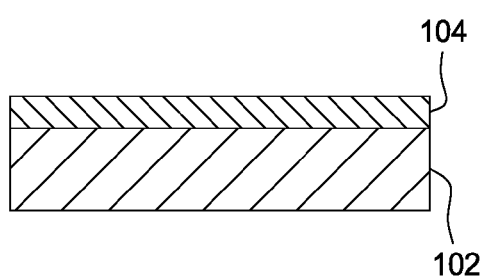
FIGS. 1A-1I illustrate the formation of a capacitive device for interposers, according to one embodiment of the invention.
Figure 1B:
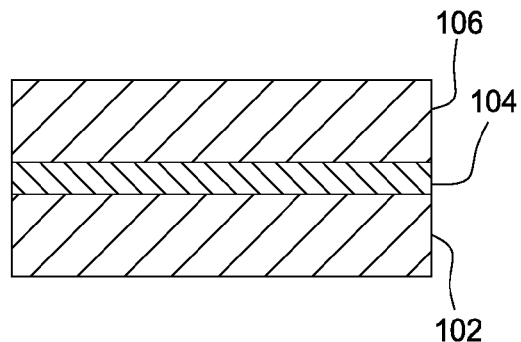

As shown in FIG. 1B, a silicon nitride layer 106 is subsequently deposited on the silicon dioxide layer 104 by chemical vapor deposition. The silicon nitride layer is deposited to a thickness of about 600 angstroms to about 1000 angstroms, for example, about 800 angstroms. The silicon nitride layer 106 may include alignment marks thereon to facilitate consistent processing of desired areas of the p-type substrate 102 during subsequent operations. The alignment marks act as reference markers for orienting the substrate and applying films thereon.

Figure 1C:
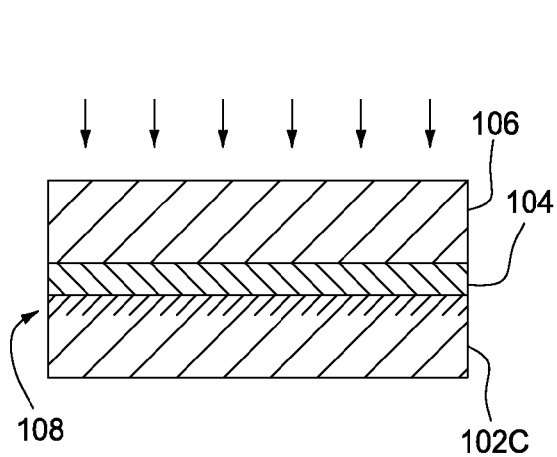
Figure 1D:
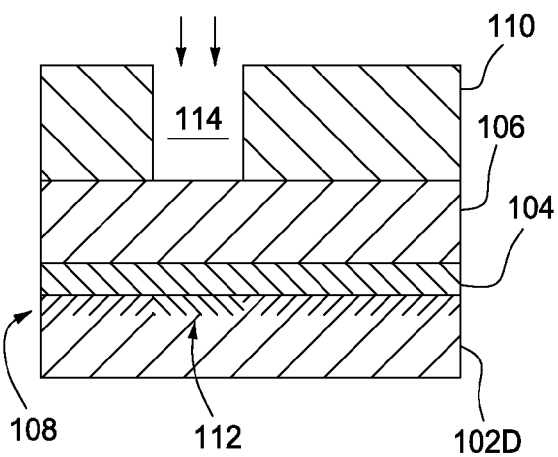

After the silicon nitride layer 106 is formed on the silicon dioxide layer 104, a p+ region 108 is formed by implanting a p-type dopant into the p-type silicon substrate 102, thus resulting in p-type silicon substrate 102C. The p+ region 108 is formed by implanting a p-type dopant, such as boron, into the p-type silicon substrate 102 to a concentration of about $1\times10^{15}$ atoms/cm$^3$, as shown in FIG. 1C. The p-type dopant is implanted at a sufficient energy and concentration to penetrate through the silicon nitride layer 106 and silicon dioxide layer 104. The presence of the silicon dioxide layer 104 during the implant increases the quality of oxides subsequently grown on the p-type silicon substrate 102, while the presence of the silicon nitride layer 106 increases the alignment accuracy of layers formed thereon. For example, the presence of the silicon nitride layer 106 may increase the alignment accuracy of a mask 110 formed on the silicon nitride layer 106, as shown in FIG. 1D.

The mask 110 is disposed on the upper surface of the silicon nitride layer 106. The mask 110 includes one or more openings 114 formed therethrough. The openings 114 facilitate the formation of n+ contact regions 112 by selectively allowing an n-type dopant, such as phosphorus or arsenic, to be implanted into the p-type silicon substrate 102C, resulting in p-type silicon substrate 102D. The n+ contact region 112 is doped to a concentration of about $1\times10^{16}$ atoms/cm$^3$. The p-type silicon substrate 102D is then annealed to activate the n-type dopant of the n+ contact region 112 and the p-type dopant of the p+ region 108.

Figure 1E:
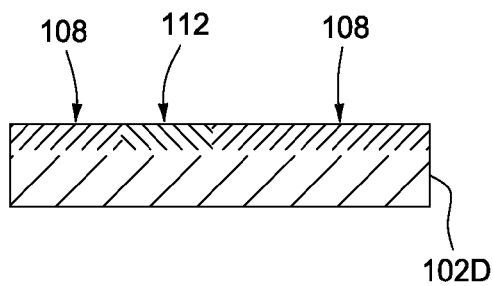

Subsequent to the implant process, the mask layer 110, the silicon nitride layer 106, and the silicon dioxide layer 102 are removed by wet or dry etching in order to expose the upper surface of the p-type silicon substrate 102D, as shown in FIG. 1E. The exposed upper surface of the p-type silicon substrate 102D includes p+ regions 108 and an n+ contact region 112. After removing the mask layer 110, the silicon nitride layer 106, and the silicon dioxide layer 104, a silicon dioxide layer 116 is grown on the surface of the p-type silicon substrate 102D. The silicon dioxide layer 116 is similar to the silicon dioxide layer 104; however, the silicon dioxide layer 116 generally includes fewer defects since the silicon dioxide layer 116 is not subjected to an implant process, unlike the silicon dioxide layer 104. The higher quality of the silicon dioxide layer 116 compared to the silicon dioxide layer 104 increases the quality of the final capacitive device because the breakdown voltage of the capacitive device is increased.

Figure 1F:
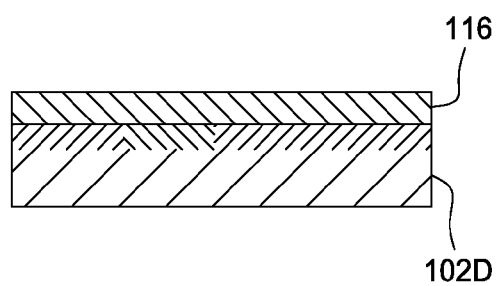
Figure 1G:
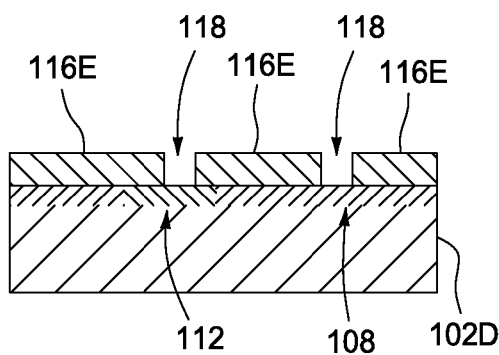
Figure 1H:
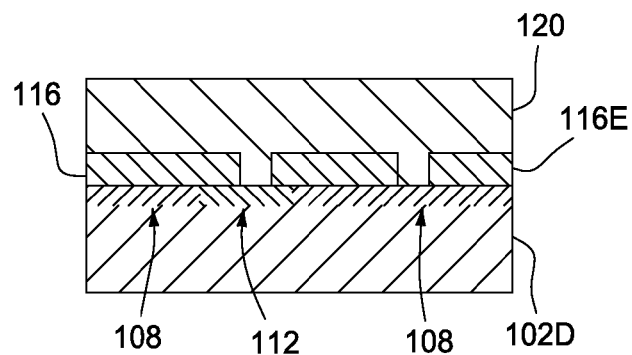

After growing the silicon dioxide layer 116, as shown in FIG. 1F, the silicon dioxide layer 116 is patterned to form a silicon dioxide layer 116E having openings 118 therethrough, as shown in FIG. 1G. The openings 118 are formed using a mask (not shown) and an etchant, similar to the formation of openings 114. A first opening 118 is positioned to expose the n+ contact region 112 through the silicon dioxide layer 116E, and a second opening 118 is positioned to expose a portion of the p+ region 108. The openings 118 facilitate an electrical connection with the n+ contact region 112 and the p+ region 108.

After formation of the openings 118 through the silicon dioxide layer 116, a silicon dioxide layer 120 is deposited on the silicon dioxide layer 116E and within the openings 118. The silicon dioxide layer 120 is deposited, for example, by chemical vapor deposition utilizing tetraethyl orthosilicate (TEOS) as a precursor. The silicon dioxide layer 120 is deposited to a thickness of about 4000 angstroms to about 6000 angstroms, for example about 5000 angstroms. The silicon dioxide layer 120 electrically isolates interconnects subsequently formed therein.

Figure 1I:
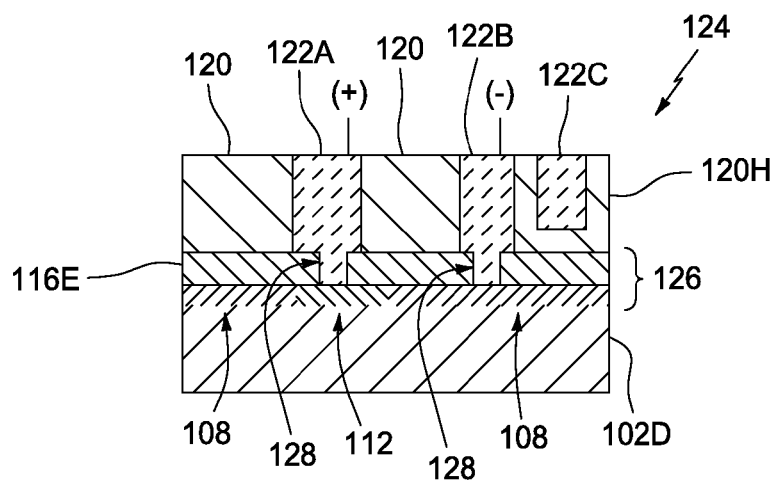

FIG. 1I illustrates an interposer 124 having a capacitive device 126 formed therein. The interposer 124 includes interconnects 122A-122C formed within the silicon dioxide layer 120H. The interconnects 122A-122C are formed by patterning and etching the silicon dioxide layer 120 to form vias within the silicon dioxide 120, thus resulting in silicon dioxide layer 120H. A conductive material is then deposited within the vias formed within the silicon dioxide layer 120H. The conductive material preferably includes copper, however, other conductive materials, such as tungsten, are also contemplated. The interconnects 122A-122C are formed, for example, by chemical vapor deposition of a conductive material within the vias, and then chemical mechanical polishing the conductive material to planarize the upper surface thereof.

The interconnect 122A is electrically coupled to the n+ contact region 112 through a contact 128. The interconnect 122A is adapted to supply power therethrough. The interconnect 122B is electrically coupled to the p+ region 108 through a contact 128. The interconnect 122B is adapted to function as an electrical ground. The interconnect 122C is formed within the silicon dioxide layer 120H as a horizontal interconnect (e.g., a "metal 1" layer). Although only three interconnects 122 and two contacts 128 are shown in the interposer 124, it is be understood that the number interconnects, the number of contacts, and the number of n+ contact regions 112 may be varied to support as many integrated circuits as desired on the interposer 124. For example, it is contemplated that a device may include two ground planes and multiple power planes with different voltages, such as 1 volt, 2.5 volts, and/or 3.3 volts.

FIGS. 1A-1I illustrate one embodiment of the formation of a capacitive device for an interposer; however, other embodiments are also contemplated. In another embodiment, it is contemplated that the silicon dioxide layer 104 may be deposited using chemical vapor deposition or atomic layer deposition. In yet another embodiment, it is contemplated that the silicon dioxide layer 104 may be formed by exposing the p-type silicon substrate 102 to an oxidative plasma. In another embodiment, it is contemplated that the silicon dioxide layer 104 and the silicon nitride layer 106 may be excluded. In yet another embodiment, it is contemplated that the silicon dioxide layer 120 may be deposited using plasma-enhanced chemical vapor deposition or thermal chemical vapor deposition. In another embodiment, it is contemplated that the interconnects 122 may be formed using physical vapor deposition. In another embodiment, it is contemplated that the n+ contact region may be formed by exposing the p-type silicon substrate 102C to POCl$_3$. In another embodiment, it is contemplated that the silicon dioxide layer 116 and the silicon dioxide layer 120 may be deposited in a single process or as a single layer.

Figure 2:
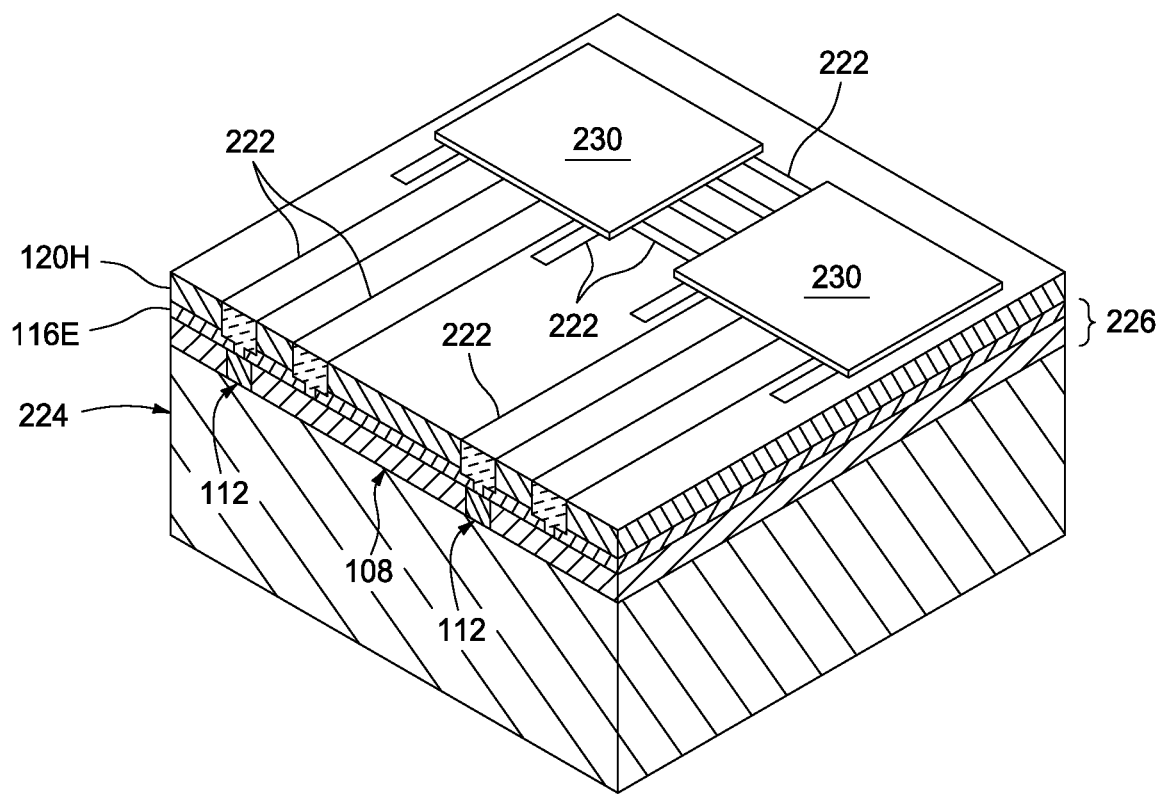
FIG. 2 illustrates integrated circuits positioned on an interposer including a capacitive device, according to one embodiment of the invention.

FIG. 2 illustrates integrated circuits 230 positioned on an interposer 224 including a capacitive device 226, according to one embodiment of the invention. The interposer 224 and the capacitive device 226 are similar to the interposer 124 and the capacitive device shown in FIG. 1I; however, the interposer 224 includes additional interconnects 222. The interposer 224 supports a plurality of integrated circuits 230 (two are shown) on an upper surface thereof. As illustrated, the interposer 224 includes two integrated circuits 230 on an upper surface thereof; however, it is contemplated that the interposer 224 may support more than two integrated circuits 230. The integrated circuits 230 may be any of an application processor, a memory component, an RF component, or other integrated circuit. The interposer 224 may also include vertically-disposed vias (e.g., through-silicon vias) therethrough to facilitate an electrical connection to a package substrate or a printed circuit board.

The capacitive device 226 is similar to the capacitive device 126 shown in FIG. 1I however, the capacitive device 226 includes additional n+ contact regions 112 to support the increased number of interconnects 222 and to reduce signal noise between the integrated circuits 230. The capacitive device 226 is formed using doped semiconductor layers rather than a metal-insulator-metal stack, and thus, is relatively inexpensive to produce compared to capacitive devices including metal layers. Moreover, the capacitance of the capacitive device 226 is about 100 nanofarad per square centimeter ($nF/cm^2$) compared to the capacitance of a metal-insulator-metal capacitor which has a capacitance of about 2 $nF/cm^2$. Therefore, the capacitive device 226 provides a greater reduction in signal noise compared to metal-insulator-metal decoupling capacitors, and is less expensive to produce.

Figure 3A:
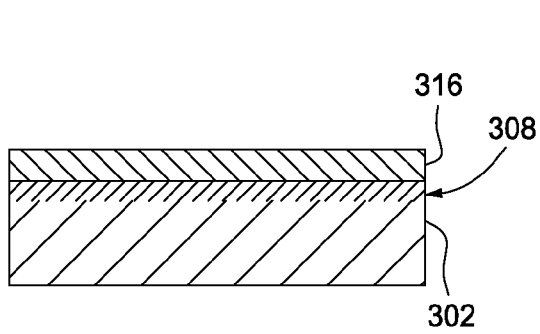
FIGS. 3A-3G illustrate the formation of a capacitive device for interposers, according to another embodiment of the invention.

FIGS. 3A-3G illustrate the formation of a capacitive device for an interposer, according to another embodiment of the invention. As shown in FIG. 3A, the interposer includes a p-type silicon substrate 302. The p-type silicon substrate 302 includes a doped n+ region 308 and a silicon dioxide layer 316 disposed over the doped n+ region 308. The silicon dioxide layer 316 is grown on the p-type substrate 302 in an oxygen-containing environment and then an n-type dopant is implanted into the p-type silicon substrate 302 to a dopant concentration of about $1 \times 10^{15}$ atoms/cm$^3$. Generally, the dopant has sufficient energy to penetrate through the silicon dioxide layer 316. The silicon dioxide layer 316 is grown to a thickness of about 40 angstroms to about 90 angstroms. The p-type silicon substrate 302 is subsequently annealed to activate the n-type dopant.

Figure 3B:
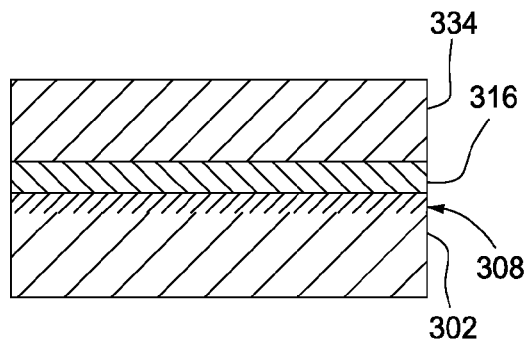
Figure 3C:
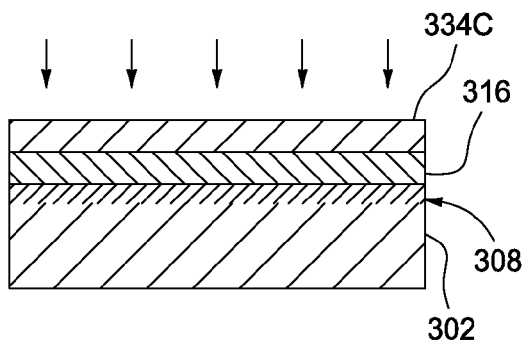
Figure 3D:
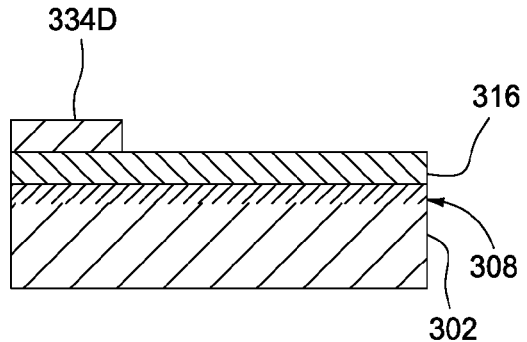
Figure 3E:
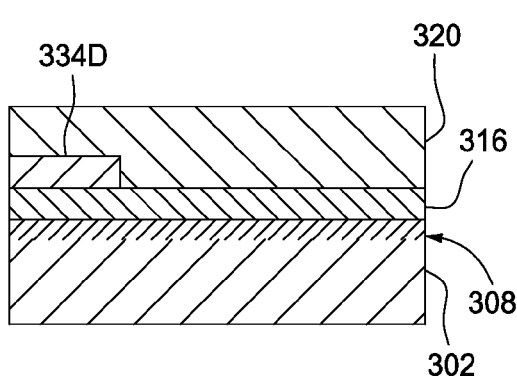

After activation of the n-type dopant, a polysilicon layer 334 is deposited over the silicon dioxide layer 316, as shown in FIG. 3B. The polysilicon layer 334 is deposited to a thickness of about 1500 angstroms to about 2500 angstroms, such as 2000 angstroms, by, for example, the thermal decomposition of silane on the upper surface of the silicon dioxide layer 316. After formation of the polysilicon layer 334, an n-type dopant is implanted into the polysilicon layer 334 to form polysilicon layer 334C, as shown in FIG. 3C. After the polysilicon layer 334 is doped, thus resulting in the polysilicon layer 334C, the polysilicon layer 334C is then patterned using a mask (not shown) and an etchant to form polysilicon layer 334D, as illustrated in FIG. 3D. A silicon dioxide layer 320 is then deposited over the polysilicon layer 334D and on the silicon dioxide layer 316, as shown in FIG. 3E. The silicon dioxide layer 320 is deposited by chemical vapor deposition utilizing tetraethyl orthosilicate (TEOS) as a precursor. The silicon dioxide layer 320 is deposited to a thickness of about 4000 angstroms to about 6000 angstroms, for example about 5000 angstroms. The silicon dioxide layer 320 electrically isolates interconnects subsequently formed therein.

Figure 3F:
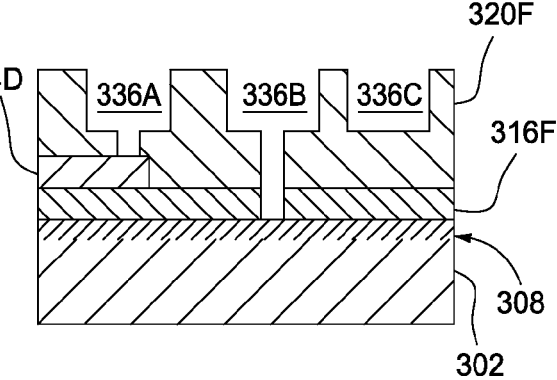
Figure 3G:
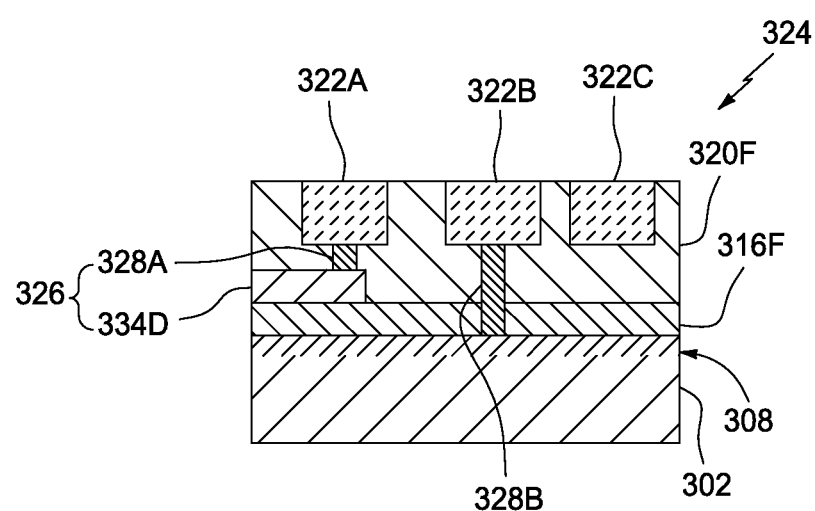

The silicon dioxide layer 320 is then etched to form silicon dioxide 320F having vias 336A-336C therein, as shown in FIG. 3F. The via 336A is formed to support an interconnect therein and to expose the polysilicon layer 334D. A second via 336 B is formed to support an interconnect therein and to expose a portion of the n+ region 308. A third via 336C is formed in the silicon dioxide layer 320F to support an interconnect therein and to support a metal 1 interconnect therein. After formation of the vias 336A-336C, a metallic contact, such as tungsten contact 328A is disposed in the via 322A in contact with the polysilicon layer 334D, as shown in FIG. 3G. Additionally, a tungsten contact 328B is disposed in the via 336B in contact with the n+ region 308. Interconnects 322A-322C, such as copper interconnects, are then disposed within each of the vias 336A-336C. The interconnect 322A is disposed in via 336A and electrically coupled to the tungsten contact 328A. The interconnect 322A facilitates power supply to integrated circuits coupled to the interposer. The interconnect 322B is disposed in via 336B and electrically coupled to the tungsten contact 328B. The interconnect 322B facilitates electrical grounding of integrated circuits coupled to the interposer.

FIG. 3G illustrates an interposer 324 including a capacitive device 326. The capacitive device 326 is similar in function to the capacitive device 226 and may be used in place thereof. The capacitive device 326 is formed using doped semiconductor layers rather than a metal-insulator-metal stack, and thus, is relatively inexpensive to produce compared to capacitive devices including metal layers. Moreover, the capacitance of the capacitive device 326 is about 10 $nF/cm^2$ compared to the capacitance of a metal-insulator-metal capacitor which has a capacitance of about 2 $nF/cm^2$. Therefore, the capacitive device 326 provides a greater reduction in signal noise compared to metal-insulator-metal decoupling capacitors.

FIGS. 3A-3G illustrate the formation of a capacitive device according to one embodiment of the invention; however, additional embodiments are also contemplated. In one embodiment, it is contemplated that the silicon dioxide layer 304 is formed using an oxidative plasma. In another embodiment, it is contemplated that n+ region may be formed by exposing the p-type silicon substrate through a sacrificial oxide layer. The sacrificial oxide layer may then be removed via etching, and the silicon dioxide layer 316 may then be grown on the upper surface of the p-type silicon substrate. In yet another embodiment, it is contemplated that the capacitive device 326 may be formed on the capacitive device 126 to produce a capacitive device having a capacitance greater than either the capacitive device 126 or the capacitive device 326 individually.

While embodiments of the invention are described with respect to specific dopant conductivity types (e.g., p-type or n-type), it is to be understood that the capacitive devices of the present invention can be formed by using the opposite conductivity type dopants in place of those described. The descriptions herein are meant to be illustrative and not restrictive.

Embodiments of the present invention include capacitive devices that can be formed on interposers to reduce signal noise and leakage between integrated circuits disposed on the interposer. The capacitive devices are formed using doped semiconductor layers on the upper surface of an interposer. In one embodiment, a p-type silicon substrate functioning as an interposer has an upper surface thereof doped with a p-type dopant. The upper surface of the p-type silicon substrate is then masked and exposed to an n-type dopant in order to form an n+ contact region on the upper surface of the p-type silicon substrate. One or more oxide layers, such as silicon oxide, are then formed on the upper surface of the p-type silicon substrate. Vias are then formed in the one or more oxide layers by patterning and etching in order to expose n+ and p+ contact regions. The vias are then metallized to form an electrical connection with the contact regions.

In another embodiment, a capacitive device is formed on an interposer by exposing the upper surface of a p-type silicon substrate to an n-type dopant. An oxide layer is then grown on the upper surface of the p-type silicon substrate, and then a polysilicon layer is then deposited on the oxide layer. The polysilicon layer is doped with an n-type dopant and patterned. A second oxide layer is then deposited over the polysilicon layer and exposed portions of the first oxide layer. The first and second oxide layers are then patterned to form vias and to expose contact regions on the polysilicon layer and the p-type substrate. The vias and contact regions are metallized to form electrical connections between integrated circuits subsequently positioned on the interposer, and a packaging substrate upon which the interposer is to be positioned during packaging.

Benefits of the present invention include efficient and inexpensive capacitive devices. The capacitive devices are formed using doped semiconductor layers, and thus, do not require relatively expensive metal layers. Moreover, the capacitance of the capacitive devices of the present invention is about 5 times to about 50 times greater than the capacitance of decoupling capacitors using metal layers. Therefore, the capacitive devices of the present invention more effectively reduce sig- While the foregoing is directed to embodiments of the present invention, other and further embodiments of the invention may be devised without departing from the basic scope thereof, and the scope thereof is determined by the claims that follow.

What is claimed is:

1. A device, comprising:
   an interposer, the interposer including:
      a capacitive device, including:
         a substrate having a first conductivity type;
         a doped region of the first conductivity type on an upper surface of the substrate;
         a doped region of a second conductivity type on the upper surface of the substrate;
         a first oxide layer disposed over the upper surface of the substrate, the first oxide layer having openings therethrough to expose a portion of the doped region of the first conductivity type and a portion of the doped region of the second conductivity type;
         a second oxide layer disposed over the first oxide layer; and
         a plurality of interconnects formed within vias disposed in the second oxide layer; and
      a support surface adapted to support a plurality of integrated circuits thereon, wherein the capacitive device decouples at least a first integrated circuit of the plurality of integrated circuits from a second integrated circuit of the plurality of integrated circuits.

2. The interposer of claim 1, wherein the substrate is a p-type silicon substrate, the first conductivity type is p-type, and the second conductivity type is n-type.

3. The interposer of claim 2, wherein the doped region of the first conductivity type is electrically coupled to a grounded interconnect, and the doped region of the second conductivity type is electrically coupled to a powered interconnect.

4. The interposer of claim 1, wherein the first oxide layer and the second oxide layer comprise silicon dioxide.

5. The interposer of claim 1, wherein the first oxide layer has a thickness of about 10 angstroms to about 200 angstroms.

6. The interposer of claim 5, wherein the second oxide layer has a thickness of about 4000 angstroms to about 6000 angstroms.

7. The interposer of claim 1, further comprising a plurality of integrated circuits electrically coupled to the plurality of interconnects.

8. The interposer of claim 1, wherein the doped region of the first conductivity type has a dopant concentration of about $1 \times 10^{15}$ atoms/cm$^3$.

9. The interposer of claim 8, wherein the doped region of the second conductivity type has a dopant concentration of about $1 \times 10^{16}$ atoms/cm$^3$.

10. A device, comprising:
    an interposer, the interposer including:
       a capacitive device, including:
          a substrate having a first conductivity type;
          a doped region of a second conductivity type on an upper surface of the substrate;
          an first oxide layer disposed on the upper surface of the substrate, the first oxide layer having openings therethrough to expose portions of the substrate;
          a polysilicon layer disposed on the first oxide layer, the polysilicon layer including a dopant of the second conductivity type;
          a second oxide layer disposed over the polysilicon layer and the first oxide layer; and
          a plurality of interconnects formed within vias disposed in the second oxide layer; and
       a support surface adapted to support a plurality of integrated circuits thereon, wherein the capacitive device decouples at least a first integrated circuit of the plurality of integrated circuits from a second integrated circuit of the plurality of integrated circuits.

11. The interposer of claim 10, wherein the substrate is a p-type substrate and the first conductivity type is p-type.

12. The interposer of claim 10, wherein the first oxide layer has a thickness of about 40 angstroms to about 90 angstroms.

13. The interposer of claim 10, wherein the second oxide layer has a thickness of about 4000 angstroms to about 6000 angstroms.

14. The interposer of claim 10, wherein a first interconnect of the plurality of interconnects is in electrical communication with the polysilicon layer.

15. The interposer of claim 14, wherein a second interconnect of the plurality of interconnects is in electrical communication with the doped region of the second conductivity type.

16. The interposer of claim 15, wherein the second interconnect of the plurality of interconnects is adapted to be electrically grounded.

17. The interposer of claim 10, further comprising a tungsten contact electrically coupling a first interconnect of the plurality of interconnects and the polysilicon layer.

18. The interposer of claim 17, further comprising a tungsten contact electrically coupling a second interconnect of the plurality of interconnects and the doped region of the second conductivity type.

19. The interposer of claim 10, wherein the polysilicon layer has a thickness of about 2000 angstroms.

20. The interposer of claim 10, further comprising a plurality of integrated circuits disposed thereon.

21. The interposer of claim 1, wherein a first interconnect of the plurality of interconnects includes a first contact in contact with the doped region of the first conductivity type, and wherein a second interconnect of the plurality of interconnects includes a second contact in contact with the doped region of the second conductivity type.

22. The interposer of claim 1, wherein the second oxide layer is disposed on the first oxide layer.

23. The interposer of claim 1, wherein at least parts of the vias are disposed in the first oxide layer.

24. The interposer of claim 1, wherein a first interconnect extends through the second oxide layer and through the first oxide layer to be in contact with the doped region of the first conductivity type, and wherein a second interconnect of the plurality of interconnects extends through the second oxide layer and through the first oxide layer to be in contact with the doped region of the second conductivity type.

* * * * *